United States Patent
Crippen et al.

(10) Patent No.: US 7,247,089 B2
(45) Date of Patent: Jul. 24, 2007

(54) AUTOMATIC RECIRCULATION AIRFLOW DAMPER

(75) Inventors: Martin Joseph Crippen, Apex, NC (US); Francis A. Kuchar, Jr., Raleigh, NC (US); Jason Aaron Matteson, Raleigh, NC (US); Brian Alan Trumbo, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/717,782

(22) Filed: Nov. 20, 2003

(65) Prior Publication Data

US 2005/0113015 A1   May 26, 2005

(51) Int. Cl.
*H05K 5/00* (2006.01)
(52) U.S. Cl. ............ 454/184; 454/195; 165/80.2; 165/104.33; 361/695
(58) Field of Classification Search ........ 454/184, 454/185, 195; 361/695, 696; 165/122, 80.2, 165/104.33; 312/236
See application file for complete search history.

(56) References Cited

U.S. PATENT DOCUMENTS

| | | | | |
|---|---|---|---|---|
| 5,412,534 A | * | 5/1995 | Cutts et al. | 361/695 |
| 5,646,823 A | * | 7/1997 | Amori | 361/695 |
| 5,822,186 A | * | 10/1998 | Bull et al. | 361/695 |
| 5,963,528 A | * | 10/1999 | Fujimura et al. | 720/655 |
| 6,000,623 A | * | 12/1999 | Blatti et al. | 236/49.3 |
| 6,185,097 B1 | * | 2/2001 | Behl | 361/695 |
| 6,301,108 B1 | * | 10/2001 | Stockbridge | 361/688 |
| 6,449,150 B1 | * | 9/2002 | Boone | 361/694 |
| 6,542,363 B2 | * | 4/2003 | White | 361/695 |
| 6,544,311 B1 | * | 4/2003 | Walton et al. | 55/385.6 |
| 6,565,163 B2 | * | 5/2003 | Behl et al. | 312/223.1 |
| 6,714,411 B2 | * | 3/2004 | Thompson et al. | 361/695 |

OTHER PUBLICATIONS

Modular Disk Assembly, IBM Technical Disclosure Bulletin (NN950835), Aug. 1, 1995, US.*

* cited by examiner

*Primary Examiner*—Derek S. Boles
(74) *Attorney, Agent, or Firm*—Kunzler + McKenzie

(57) ABSTRACT

An automatic recirculation airflow damper for use in electronic enclosures utilizing multiple air moving devices to cool electronic components within the enclosure. When an air moving device is removed, the damper automatically closes an orifice associated with the absent air moving device, thus preventing the loss of cooling air from the vacated orifice and the subsequent reduction in cooling capacity. In some embodiments, the damper is attached to the enclosure with hinges. In certain embodiments, the damper is configured with elastomeric material such that the interface between the orifice and the damper offers high impedance to airflow while the damper is in a closed position. The automatic recirculation airflow damper reduces electronic thermal failures and therefore increases the reliability of a system equipped with the device.

15 Claims, 4 Drawing Sheets

AUTOMATIC RECIRCULATION AIRFLOW DAMPER

BACKGROUND OF THE INVENTION

1. Field of the Invention

The present invention relates to maintaining airflow in order to cool electronic components. Specifically, the invention relates to apparatus and systems to maintain airflow over electronic components when an air moving device is absent.

2. Relevant Art

The electronics industry is constantly striving for increased performance in electronic products. The increased performance is commonly achieved through higher and higher levels of integration, resulting in the use of components that dissipate more heat per unit volume. As the number of components increases within a given computer, the amount of heat generated by electronic components also increases. The increase in generated heat per unit volume has not been tracked by an equal reduction in power dissipation for the individual components. For example, on densely populated circuit boards, the power dissipation per unit area continues to increase.

Many electronic components are designed to work at relatively low temperatures. Typically, heat removal is achieved by blowing cool air over the components with a fan. Some configurations cool by creating high pressure within the enclosure, using a fan to draw cool air into the enclosure, and direct the cool air over heat transfer components as the air seeks a lower pressure exhaust orifice. Other configurations cool by creating low pressure within the enclosure using a fan to exhaust hot air, thereby drawing cool air into an inlet orifice and over heat transfer components on the way to the exhaust orifice.

As the number of components per printed circuit assembly has increased, the amount of heat dissipated per component has increased, and the density of printed circuit assemblies in rack mounted equipment has increased, traditional single fan cooling is no longer sufficient to effectively remove heat. Computer manufacturers have subsequently used more powerful fans and blowers and employed multiple air moving devices to create the airflow necessary to remove the heat from the electronics enclosure.

Typically, air moving devices have moving parts and tend to have a high duty cycle. Low-cost air moving devices are often used to reduce system cost. As a result, air moving devices often have a lower reliability than other components of a typical computer system. In addition, air moving devices often create acoustic noise, which noise tends to increase over time with wear and cause annoyance to users and maintenance personnel.

The aforementioned characteristics often lead to frequent replacement of the air moving devices. Since removal of an air moving device does not directly effect operation of the system, the air moving device is frequently replaced without turning off system power. Even if other air moving devices remain operational during replacement, a gap left by removing the defective air moving device often disturbs air flow and may permit cool air to escape from the enclosure without removing heat generated by the electronic components. If many air moving devices are present, some air moving devices may be removed without immediate replacement.

When airflow is inadequate to cool electronic components even for just a few moments, some electronic components may sense a thermal runaway condition and shutdown—resulting in risky and potentially costly system crashes. Other components may be damaged or degraded. Due to the risks associated with inadequate airflow, there is a need to maintain adequate airflow during replacement. Accordingly, there is a need for a mechanisms and systems that maintain proper airflow over heat generating components while an air moving device is absent.

BRIEF SUMMARY OF THE INVENTION

The present invention has been developed in response to the present state of the art, and in particular, in response to the problems and needs in the art that have not yet been fully solved by currently available electronic cooling systems. Accordingly, the present invention has been developed to provide an apparatus and system for automatically maintaining air flow over electronic components while one or more of a group of air moving devices is absent, thus overcoming many or all of the above-discussed shortcomings in the art.

In one aspect of the present invention, a device for automatically obstructing air flow through an orifice associated with an absent air moving device, includes an orifice cover and a cover actuator, the cover actuator configured to move the orifice cover from an open position to a closed position, covering the orifice, in response to removal of an associated air moving device. In certain embodiments, the orifice cover is a plate. In some embodiments, the cover actuator is a spring. In certain embodiments, the cover is attached to an enclosure wall by a hinge. In some embodiments, the cover actuator is a torsion spring. In certain embodiments, an elastomeric material is attached to the damper plate at the point where the cover interfaces with the orifice to further restrict air passage.

In another aspect of the present invention, a system for automatically obstructing air flow through an orifice associated with an absent air moving device, that includes an enclosure wherein cooling airflow is provided by multiple air moving devices, an orifice cover associated with each air moving device, and one or more cover actuators that position the orifice cover over the orifice at the time the associated air moving device is removed. The air moving devices are attached to the enclosure such that a mechanical interference is created between the air moving device and the orifice cover, forcing the orifice cover away from the orifice and into a vacant space. When the air moving device is removed the orifice cover automatically covers the orifice and prevents air from escaping through the orifice, thus enabling cooled air to pass over heat transfer components on the way to an exhaust orifice.

These and other features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

It will be readily understood that the components of the present invention, as generally described and illustrated in the Figures herein, may be arranged and designed in a wide variety of different configurations. Thus, the following more detailed description of the embodiments of the apparatus, method, and system of the present invention, as represented in FIGS. 1 through 5, is not intended to limit the scope of the invention, as claimed, but is merely representative of selected embodiments of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment and the described features, structures, or characteristics may be combined in any suitable manner in one or more embodiments.

Figure 1:
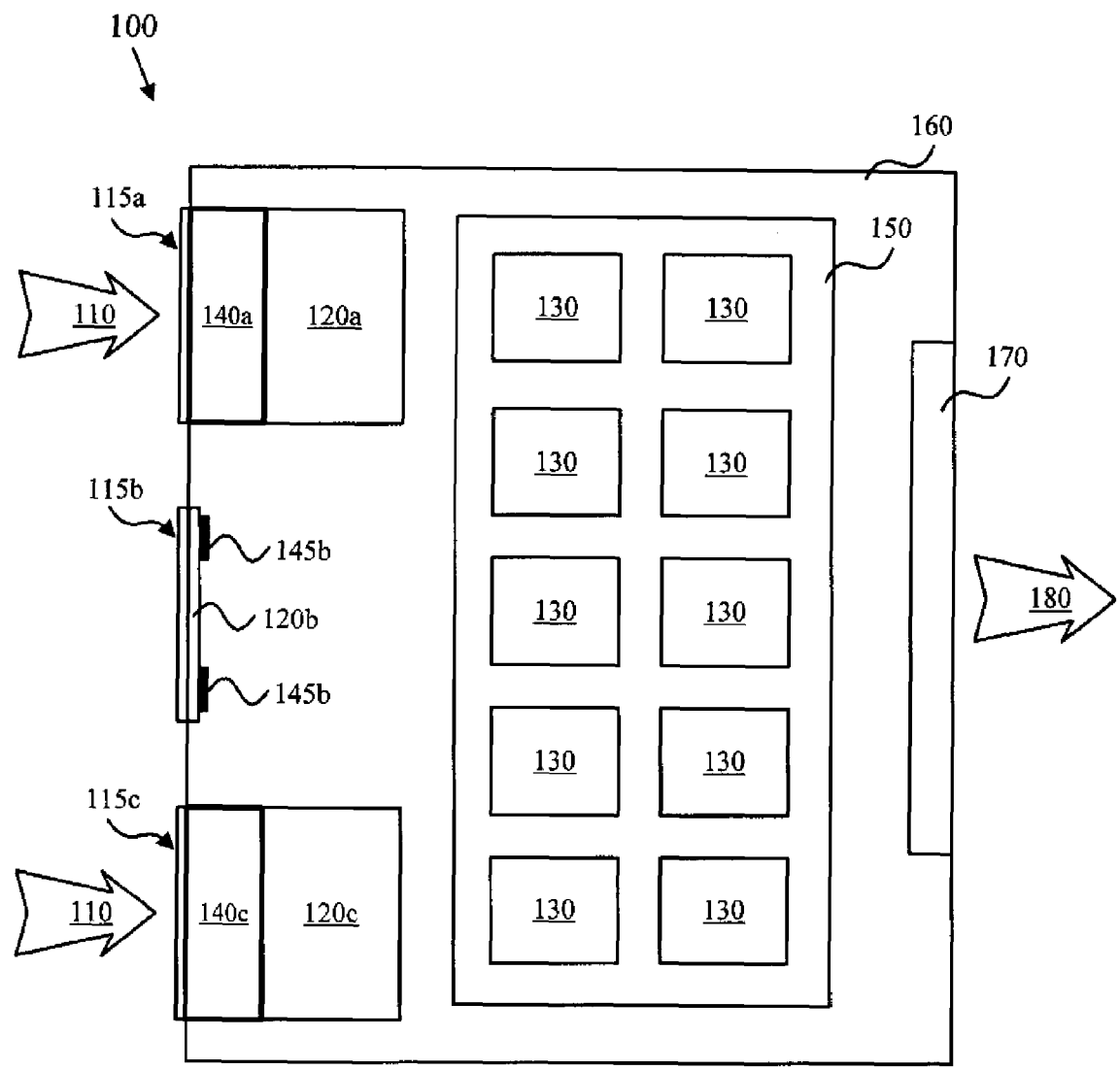
FIG. 1 is a block diagram illustrating one embodiment of an electronic component cooling system with automatic airflow damper of the present invention, wherein one of the air moving devices has been removed.

FIG. 1 is a block diagram illustrating one embodiment of an electronic component cooling system 100 of the present invention. The depicted embodiment includes cool air 110, orifices 115, orifice covers 120, heat transfer components 130, air moving devices 140, cover springs 145, a printed circuit board 150, an enclosure 160, an exhaust orifice 170, and heated air 180. The electronic component cooling system 100 automatically adjusts for the absence of an air moving device 140.

In the depicted arrangement, the air-moving devices 140a and 140c draw the cool air 110 into the enclosure 160, creating positive pressure. As the pressurized air seeks the lower pressure of the exhaust orifice 170, cool air 110 is directed across the printed circuit board 150. The cool air 110 removes heat from the heat transfer components 130, and then flows through the exhaust orifice 170 as heated air 180.

The orifice covers 120 are sized to cover the orifices 115 where cool air 110 is drawn into the enclosure 160 by the air moving devices 140. In one embodiment, the orifice covers 120 are attached to the enclosure 160 by hinges (not shown). Cover springs (not shown) beneath orifice covers 120a and 120c exert torques directed to move orifice covers 120a and 120c into a closed position against orifices 115a and 115c. The depicted embodiment illustrates a condition wherein the air moving devices 140a and 140c displace the orifice covers 120a and 120c into vacant spaces below air moving devices 140a and 140c.

In the depicted arrangement, no air moving device is present at orifice 115b enabling cover springs 145b to position orifice cover 120b against orifice 115b and stop airflow through orifice 115b. With inlet orifice 115b closed, positive pressure is maintained within the enclosure 160, forcing air across the printed circuit board 150 and out the exhaust orifice 170. If airflow was not blocked by the orifice cover 120b, the cool air 110 would enter the enclosure through orifices 115a and 115c and directly exit the enclosure through orifice 115b. This recirculating flow of the cool air 110 would significantly reduce the flow of cool air over the heat transfer components 130. The recirculating flow of the cool air 110 would also significantly reduce the flow of the heated air 180 out of the exhaust orifice 170, and thereby severely limit the ability of the cooling system 100 to remove heat from the enclosure 160.

Figure 2:
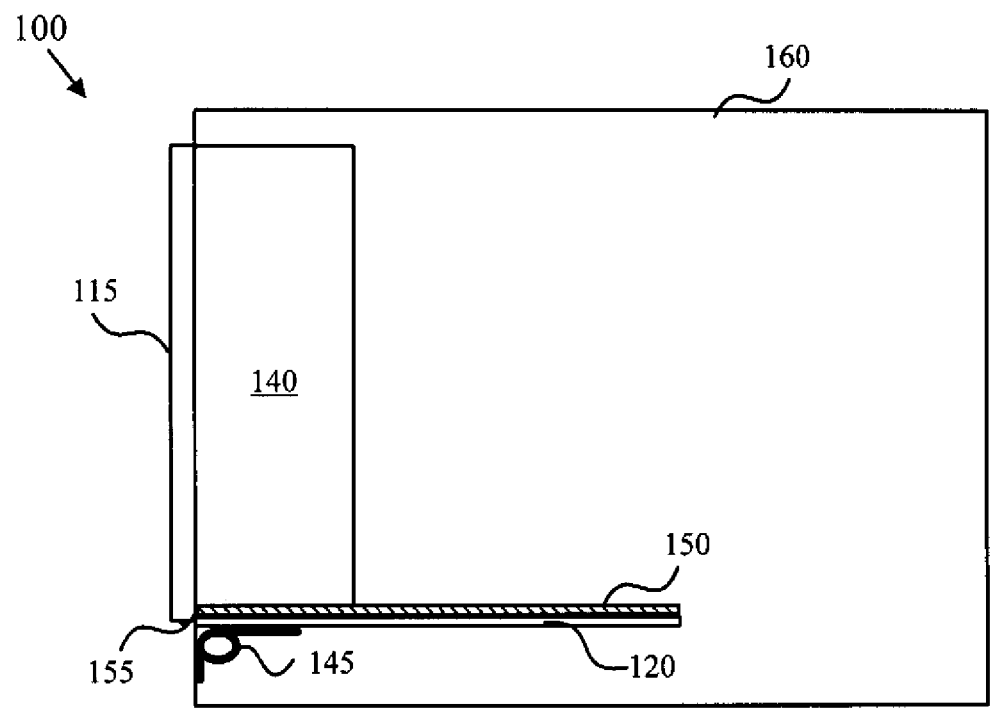
FIG. 2 is a side view illustration further depicting one embodiment of the electronic component cooling system of FIG. 1.

FIG. 2 is a side view illustration further depicting one embodiment of the automatic airflow damper system 100. The illustration depicts many of the elements shown in FIG. 1 such as the inlet orifice 115, an air moving device 140, an orifice cover 120, a cover spring 145, and an enclosure 160. The depicted air moving device 140 may correspond to the air-moving devices 140a and 140c shown in FIG. 1.

The air moving device 140 draws cool air into the enclosure 160 through the inlet orifice 115. The orifice cover 120 is sized to cover the inlet orifice 115 when in a vertical, closed position, a seal 150 blocking airflow between the enclosure 160 and orifice cover 120. The cover spring 145 is attached to the enclosure 160 and the orifice cover 120. The cover spring 145 is configured to exert a torque on the orifice cover 120 directed to rotate the orifice cover 120 about a lower edge 155 to seat against the inlet orifice 115. The air moving device 140 is attached to the enclosure 160 such that the air moving device 140 interferes with the orifice cover 120 motion toward the inlet orifice 115, forcing the orifice cover 120 into a vacant space beneath the air moving device 140. The seal 150 allows the orifice cover 120 to pivot to the vacant space.

Figure 3:
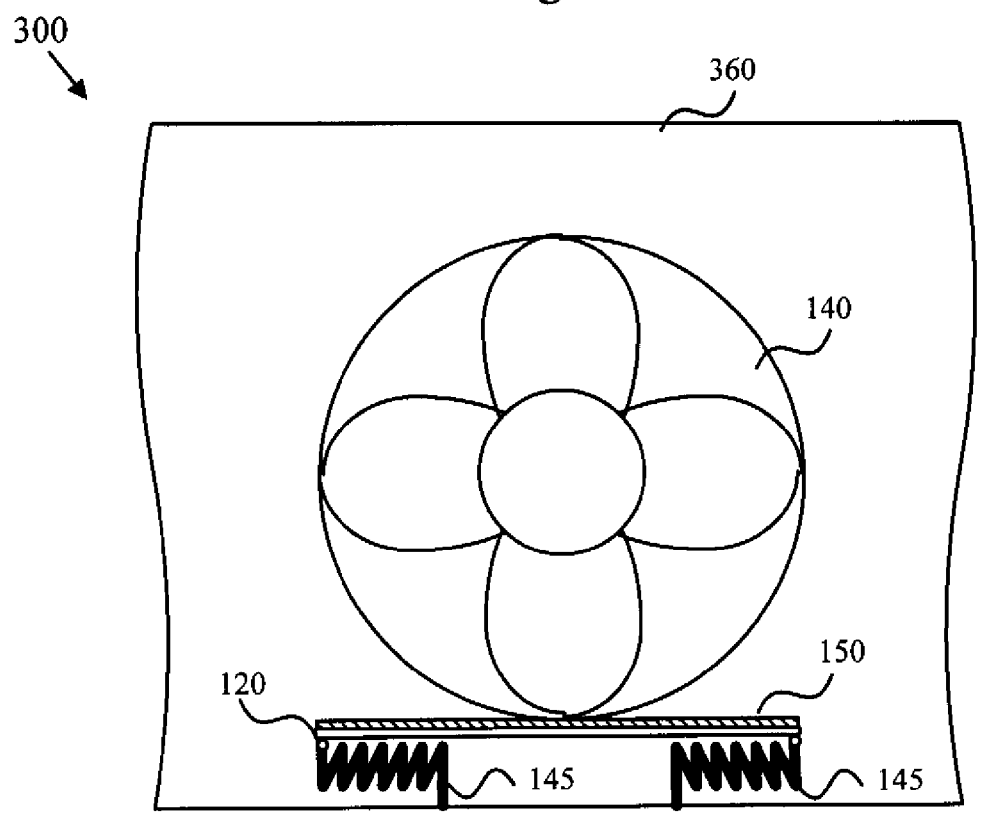
FIG. 3 is a front view illustration depicting one embodiment of an automatic airflow damper of the present invention.

FIG. 3 is a front view illustrating one embodiment of an automatic airflow damper system 300. The depicted embodiment includes an air moving device 140, an orifice cover 120, cover actuators 145, and part of an enclosure wall 360. The air moving device 140 draws cool air into an enclosure through an inlet orifice (not shown) behind the air moving device 140. The orifice cover 120 is sized to cover the inlet orifice (not shown) behind the air moving device 140 when in a vertical, closed position.

Figure 6:
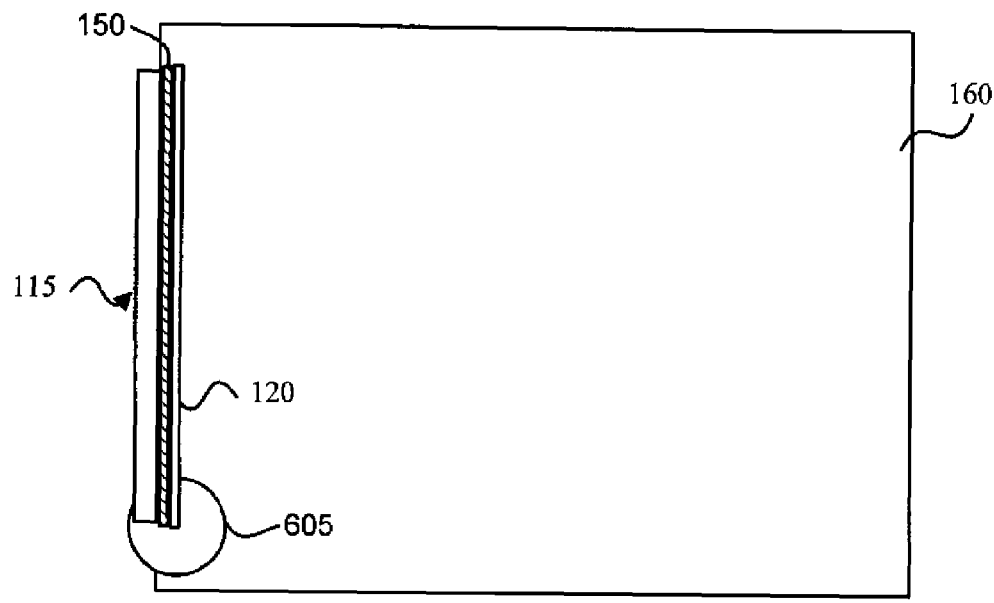
FIG. 6 is a side view illustration depicting one embodiment with a motor of an actuated automatic airflow damper of the present invention.
Figure 7:
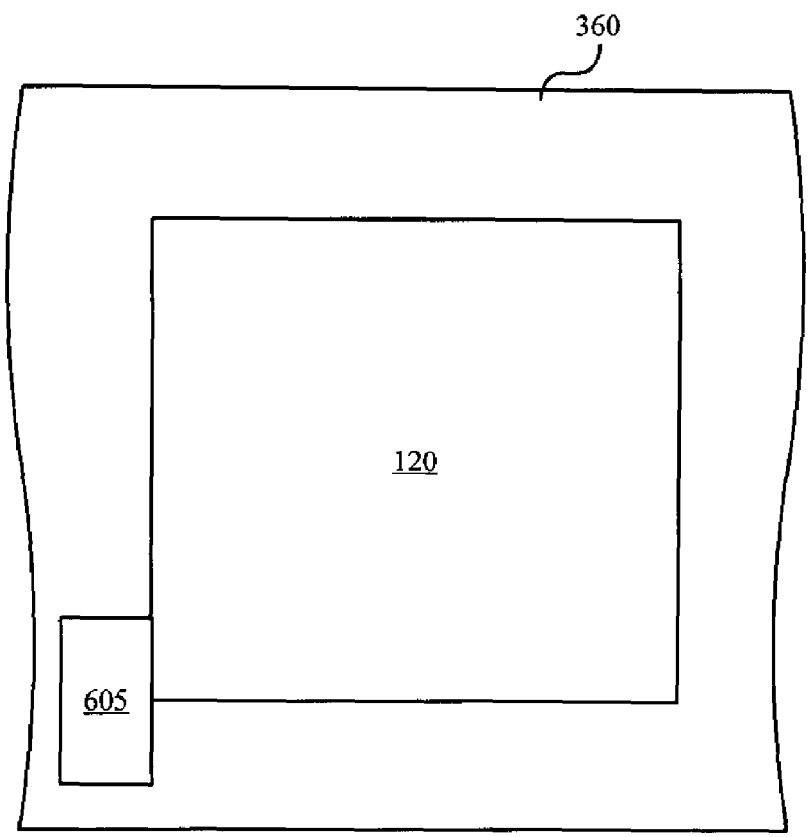
FIG. 7 is a front view illustration depicting one embodiment with a motor of an actuated automatic airflow damper of the present invention.

The cover actuators 145 are attached to the enclosure wall 360 and the orifice cover 120. In the depicted embodiment, the cover actuators are torsion springs. In another embodiment, the cover actuators are spring loaded pistons. In yet another embodiment, the cover actuators comprise a motor 605 as shown in FIGS. 6 and 7. The depicted cover actuators 145 are configured to exert a torque on the orifice cover 120, directing rotation of the orifice cover 120 toward the inlet orifice (not shown) behind the air moving device 140. The air moving device 140 is attached to the enclosure wall 360 such that it creates a mechanical interferes between the orifice cover 120 and the air moving device 140, forcing the orifice cover 120 into a vacant space beneath the air moving device 140.

Figure 4:
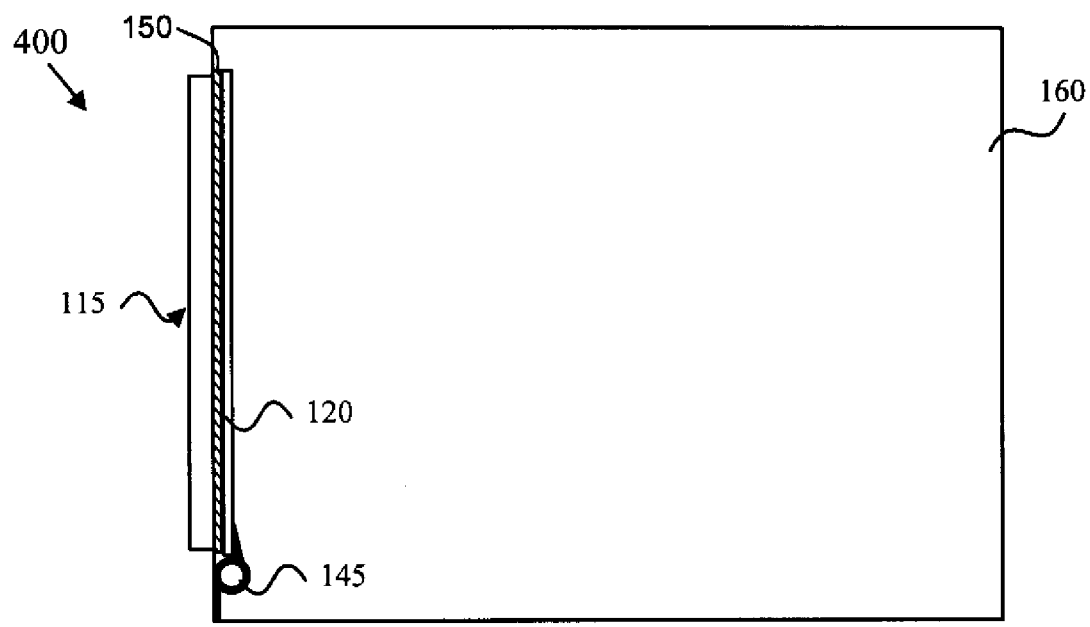
FIG. 4 is a side view illustration depicting one embodiment of an actuated automatic airflow damper of the present invention.

FIG. 4 is a side view illustrating one embodiment of an actuated automatic airflow damper system 400. The depicted embodiment includes an inlet orifice 115 as shown in FIG. 1, an orifice cover 120 shown in FIG. 1, a cover actuator 145 as illustrated in FIG. 1, and an enclosure 160 as shown in FIG. 1. An air moving device (not shown) that is normally attached to the enclosure wall adjacent to the inlet orifice 115 is absent. The orifice cover 120 is forced against the inlet orifice 115 by the torque exerted on the orifice cover 120 by the cover actuator 145. With the orifice cover 120 covering the inlet orifice 115, positive air pressure within the enclosure 160 cannot escape through the inlet orifice 115.

Figure 5:
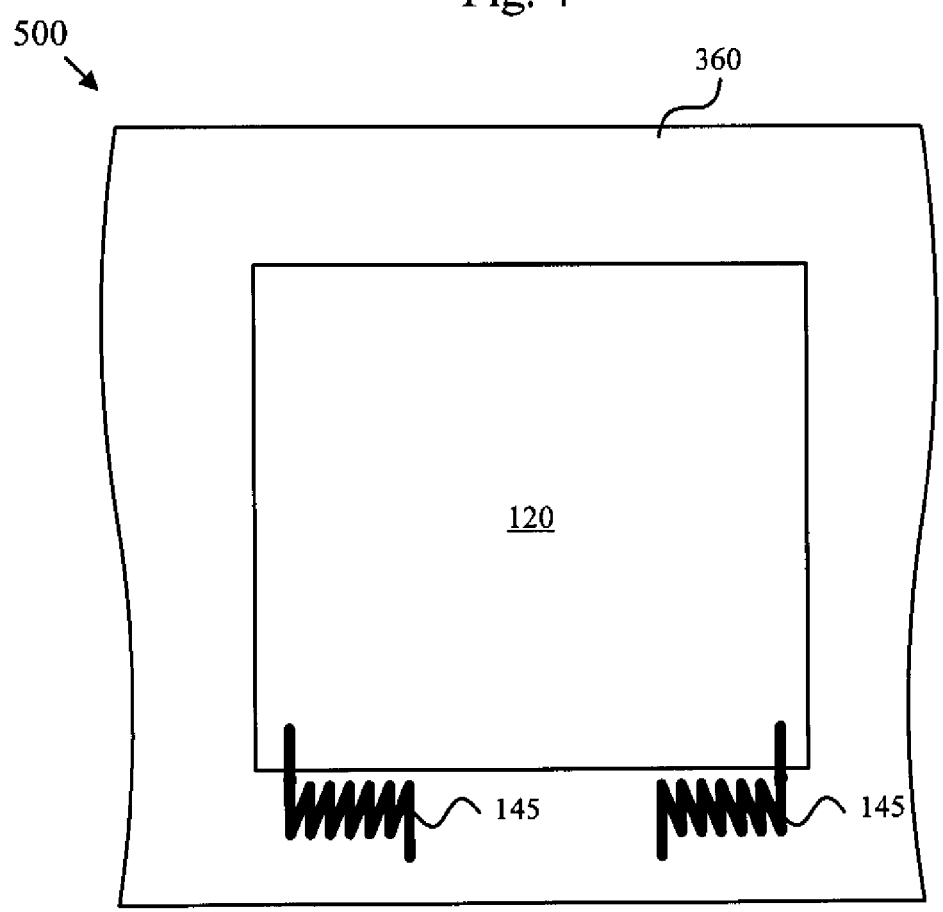
FIG. 5 is a front view illustration depicting one embodiment of an actuated automatic airflow damper of the present invention.

FIG. 5 is a front view illustrating one embodiment of an actuated automatic airflow damper system 500. The depicted embodiment includes a orifice cover 120 as illustrated on FIG. 1, cover actuators 145 as shown in FIG. 1, and a portion of an enclosure wall 360 as shown in FIG. 3. An air moving device (not shown) that is normally attached to the enclosure wall adjacent to the inlet orifice 115 is absent.

The orifice cover 120 is sized to cover the inlet orifice (not shown) behind the orifice cover 120. The cover actuators 145 are attached to the enclosure wall 360 and the orifice cover 120. The orifice cover 120 is forced against the inlet orifice (not shown) behind the damper plate 120 by the torque exerted on the orifice cover 120 by the cover actuators 145. With the orifice cover 120 covering the inlet orifice (not shown), positive air pressure within the enclosure cannot escape through the inlet orifice 115.

The present invention facilitates cooling of electronic components while an air moving devices is absent. Without the automatic recirculation airflow damper of the current invention, the orifices associated with an absent air moving devices allow cool air to escape without removing heat from the electronic components in an enclosure. This lack of heat removal may cause high dissipation electronic components to overheat, and subsequently fail prematurely.

The configuration of the current invention wherein a orifice cover automatically covers the orifice associated with an absent air moving device is effective in maintaining positive or negative air pressure within the enclosure, enabling the cool air to remove heat from electronic components. The current invention promotes cooling of the enclosure during the time when an air moving device is being replaced. It also promotes cooling when an air moving device is removed and not replaced for a period of time, by insuring that the cool air drawn into the enclosure by the remaining air moving devices is directed past the electronic components that need to be cooled.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An apparatus for automatic airflow damping, the apparatus comprising:
   an enclosure configured for positive air pressure and comprising an orifice configured to pass air, the orifice disposed in a vertical plane of an outer wall of the enclosure;
   an orifice cover configured to pivot about a lower edge and having an open position configured to permit airflow though the orifice wherein the orifice cover is horizontally disposed and a closed position wherein the orifice cover is vertically disposed and configured to block airflow from exiting through the orifice while the orifice cover is in the closed position;
   a cover actuator configured to move the orifice cover from the open position to the closed position in response to removal of an air moving device; and
   a seal disposed on the orifice cover and comprising a layer of elastomeric material and configured to block airflow between the enclosure and the orifice cover while in the closed position and allowing the orifice cover to pivot to the open position.

2. The apparatus of claim 1, wherein the cover actuator is a spring.

3. The apparatus of claim 2, wherein the spring is a torsion spring.

4. The apparatus of claim 1, wherein the orifice cover is a plate.

5. The apparatus of claim 1, further comprising a vent configured to pass air.

6. The apparatus of claim 1, wherein the cover is further configured with a mechanical hinge.

7. The apparatus of claim 1, wherein the air-moving device is configured to force air through the orifice.

8. The apparatus of claim 7, wherein the air moving device is a fan.

9. The apparatus of claim 7, wherein the air moving device is a blower.

10. An apparatus for automatic airflow damping, the apparatus comprising:
    means for passing air through an orifice disposed in a vertical plane of outer wall of an enclosure in order to cool electronic components in the enclosure, the enclosure configured for positive air pressure;
    means for obstructing the orifice;
    means for moving the obstructing means from an open position wherein the obstructing means is horizontally disposed to a closed position wherein the obstructing means is vertically disposed in response to removal of an air moving device associated with the orifice; and
    means for blocking airflow around the obstructing means while in the closed position using a layer of elastomeric material and allowing the obstructing means to pivot to the open position, wherein the blocking means is disposed on the obstructing means.

11. A method for automatic airflow damping, the method comprising:
    passing air through an orifice in an enclosure in order to cool electronic components in the enclosure, the enclosure configured for positive air pressure and the orifice disposed in a vertical plane of an outer wall of the enclosure;
    moving an orifice cover about a lower edge from an open position wherein the orifice cover is horizontally disposed to a closed position wherein the orifice cover is vertically disposed in response to removal of an air moving device associated with the orifice; and
    sealing between the enclosure and the orifice cover to block airflow between the enclosure and the orifice cover while in the closed position and allowing the orifice cover to move to the open position using a seal disposed on the orifice cover.

12. The method of claim 11, wherein passing air through an orifice comprises blowing air into the enclosure.

13. The method of claim 11, wherein passing air through an orifice comprises exhausting air from the enclosure.

14. The method of claim 11, further comprising blocking airflow through the orifice.

15. A system utilizing automatic airflow damping, the system comprising:

a plurality of electronic components;

an enclosure configured to enclose the plurality of electronic components and maintain positive air pressure, the enclosure comprising an orifice configured to pass air the orifice disposed in a vertical plane of an outer wall of the enclosure;

the orifice cover configured to pivot about a lower edge and having an open position configured to permit airflow through the orifice wherein the orifice cover is horizontally disposed and a closed position wherein the orifice cover is vertically disposed and configured to block airflow from exiting through the orifice;

a cover actuator comprising a motor and configured to move the orifice cover from the open position to the closed position in response to removal of an air moving device; and a seal disposed on the orifice cover and comprising a layer of elastomeric material and configured to block airflow between the enclosure and the orifice cover while in the closed position and allowing the orifice cover to pivot to the open position.

* * * * *